United States Patent
Garalapuraiaha et al.

(10) Patent No.: US 6,531,863 B1
(45) Date of Patent: Mar. 11, 2003

(54) SOLID-STATE RESIDENTIAL METER INCLUDING A DISK ANALOG DISPLAY

(75) Inventors: Manjunath Garalapuraiaha, Farmington, CT (US); Matthew D. Marple, Plainville, CT (US); Karl Pedersen, Ansonia, CT (US); Eric B. Reed, E. Berlin, CT (US); Leslie Rosenau, Dover, NH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/107,736

(22) Filed: Jun. 30, 1998

(51) Int. Cl.[7] ............................................. G01R 11/32
(52) U.S. Cl. .................... 324/142; 324/103 R
(58) Field of Search .................. 324/142, 107, 324/113, 103 R, 99 D, 108, 89; 702/60, 61, 62; 340/651; 345/38, 33

(56) References Cited

U.S. PATENT DOCUMENTS 4,902,964 A * 2/1990 Szabela et al. ............. 324/142
5,039,936 A * 8/1991 Gonzales .................... 324/108
5,298,853 A * 3/1994 Ryba ............................ 324/86
5,371,511 A * 12/1994 Atherton, Jr. et al. ........ 345/38
5,525,898 A * 6/1996 Lee, Jr. et al. .............. 324/142

* cited by examiner

Primary Examiner—Vinh P. Nguyen
(74) Attorney, Agent, or Firm—Karl A. Vick, Esq.; Armstrong Teasdale LLP

(57) ABSTRACT

A disk analog display for a solid state electricity meter includes a series of segments that illuminate sequentially to indicate the direction of current flowing through the meter and the rate at which energy is being consumed by the load. The sequential illumination provides notice to a technician that the meter is completing the measurement of one energy consumption unit so that the measurement by the meter of one energy consumption unit can be accurately timed. In one embodiment, there are three segments that illuminate sequentially to indicate that the meter is completing measurement of one energy consumption unit. The segments then simultaneously blank to indicate that the meter has completed the measurement of one energy consumption unit.

20 Claims, 2 Drawing Sheets

SOLID-STATE RESIDENTIAL METER INCLUDING A DISK ANALOG DISPLAY

FIELD OF THE INVENTION

This invention relates generally to electricity meters and, more particularly, to solid-state residential meters.

BACKGROUND OF THE INVENTION

Known mechanical electricity meters include a rotating disk to register, or measure, energy delivered to a load. The disk is coupled to a register. The disk rotates at a speed proportional to energy consumed by the load, and the register displays the amount of energy consumed by the load. To determine whether the meter is operating correctly, e.g., properly coupled between the power lines and a load, a portion of the disk is visible from outside the meter. A technician can view the disk and then easily determine whether the meter is properly connected by observing the direction of rotation of the disk. The direction of current flow is indicated by the direction of rotation of the disk.

Solid state, or electronic, electricity meters are becoming more prevalent in the industry. Electronic electricity meters do not include a rotating disk. Rather, such meters may include an integrated circuit. The integrated circuit is connected to a display enabling energy consumption to be read from outside the meter. One disadvantage of many known electronic electricity meters is the inability to visually display a rotating disk that indicates the direction of current flow through the meter. An additional disadvantage is that the rate at which energy is being consumed by the load is not visually displayed.

Accordingly, it would be desirable to provide a display visible from outside the meter that indicates the rate and direction of power flowing through the meter in an easy to read format.

SUMMARY OF THE INVENTION

These and other objects may be attained by an electronic electricity meter that includes a disk analog display including an energy consumption display. In addition to the energy consumption display, the meter display includes a series of segments that indicate the direction of current flow and the rate of energy consumption. In one embodiment, the series of segments turn on, or illuminate, to indicate the direction of current flowing through the meter and the rate of energy being consumed by the load. The series of segments includes a first segment, a second segment, and a third segment that are activated, or illuminate, in a pre-set sequence as energy is consumed. The segments are deactivated, or blank, to indicate the time it takes one energy unit to be consumed by the load.

In one embodiment, the first segment illuminates when approximately 70% of the energy consumption unit is measured, the second segment illuminates when approximately 80% of the energy consumption unit is measured, and the third segment illuminates when approximately 90% of the energy consumption unit is measured. Then, the first, second, and third segments blank when approximately 100% of the unit is consumed by the load. This sequence provides a "ready, set, go" indicator to provide adequate notice that the end of the unit is approaching.

The sequence alerts the technician that the meter is completing the measurement of one energy consumption unit and allows the technician to precisely determine the length of time it takes the unit of energy to be consumed by the load. The segments illuminate in reverse order if the current flows through the meter in the opposite direction.

The above described disk analog display for an electronic electricity meter indicates the direction of current flow through the meter and the rate at which energy is being consumed by the load. The display also provides a "ready, set, go" indicator to alert a technician to the approaching end of an energy consumption unit.

DETAILED DESCRIPTION

Figure 1:
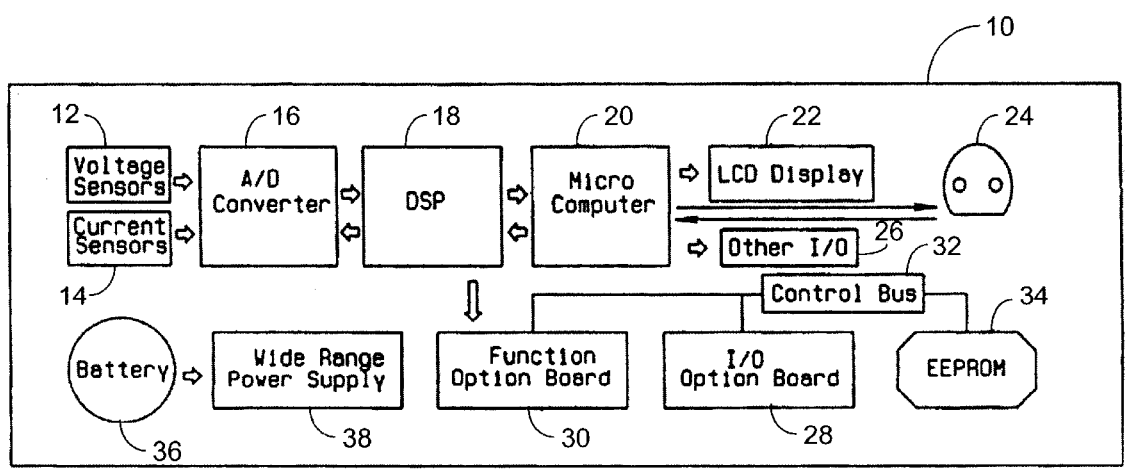
FIG. 1 is a block diagram of an electric energy meter.

FIG. 1 is a block diagram illustration of an exemplary electronic energy meter 10 which, for example, is commercially available from General Electric Company, 130 Main Street, Somersworth, N.H. 03878, and generally referred to as the KV meter. Although the present apparatus and methods are described herein in the context of an electronic electricity meter, it should be understood that the present invention is not limited to practice with any one particular meter. The present invention can be utilized in connection with other microcomputer based meters.

Referring now specifically to FIG. 1, meter 10 includes voltage sensors 12 and current sensors 14. Sensors 12 and 14, in operation, typically are coupled to the power lines supplying power to the site at which the meter is located. Sensors 12 and 14 are coupled to an analog to digital (A/D) converter 16 which converts the input analog voltage and current signal to digital signals. The output of converter 16 is provided to a digital signal processor (DSP) 18. DSP 18 supplies microcomputer 20 with digitized metering quantities, e.g., $V^2H$, $I^2H$. Microcomputer 20, using the metering quantities supplied by DSP 18, performs additional metering calculations and functions. DSP 18 may, for example, be a processor commercially available as Model Number TMS320 from Texas Instruments Company, P.O. Box 6102, Mail Station 3244, Temple, Tex. 76503, modified to perform metering functions.

Microcomputer 20 is coupled to a liquid crystal display 22 to control the display of various selected metering quantities and to an optical communications port 24 to enable an external reader to communicate with computer 20. Port 24 may be the well known OPTOCOM™ port of General Electric Company, 130 Main Street, Somersworth, N.H. 03878, which is in accordance with the ANSI type II optical port. Microcomputer 20 may also generate additional outputs 26 used for various other functions as is well known in the art. Microcomputer 20 may, for example, be an eight bit microcomputer commercially available from Hitachi America, Inc., Semiconductor & I.C. Division, Hitachi Plaza, 2000 Sierra Point Parkway, Brisbane, Calif. 94005-1819, modified to perform metering functions.

Microcomputer 20, in one embodiment, also is coupled to an input/output (I/O) board 28 and to a function, or high function, board 30. DSP 18 also supplies outputs directly to high function board 30. Microcomputer 20 further is coupled, via a control bus 32, to an electronically erasable programmable read only memory (EEPROM) 34. I/O board 28 and high function board 30 also are coupled, via bus 32, to EEPROM 34.

Back-up power is supplied to the meter 10 by a power outage battery 36 coupled to a wide range power supply 38. In normal operation when no back-up power is required, power is supplied to the meter components from the power lines via power supply 38.

Many functions and modifications of the components described above are well understood in the metering art. The present application is not directed to such understood and known functions and modifications. Rather, the present application is directed to the methods and structures described below in more detail. In addition, although the methods and structures are described below in the hardware environment shown in connection with FIG. 1, it should be understood that such methods and structures are not limited to practice in such environment. The subject methods and structures could be practiced in many other environments.

Further, it should be understood that the present invention can be practiced with many alternative microcomputers, and is not limited to practice in connection with just microcomputer 20. Therefore, and as used herein, the term microcomputer is not limited to mean just those integrated circuits referred to in the art as microcomputers, but broadly refers to microcomputers, processors, microcontrollers, application specific integrated circuits, and other programmable circuits.

Figure 2:
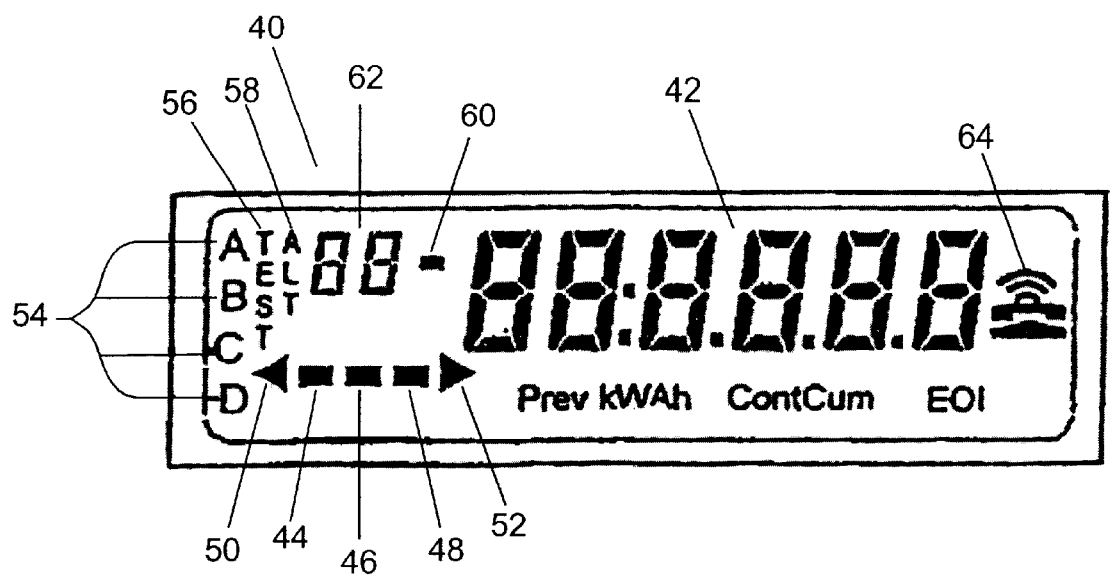
FIG. 2 is a schematic of a display for the electronic energy meter described in FIG. 1.

FIG. 2 is a schematic illustration of one embodiment of a display 40 for a meter. Display 40 is one embodiment of liquid crystal display 22. Display 40 includes a register display 42 that indicates the register values, date, time, and interval information. The register value indicates the amount of energy consumed by the load during a predetermined unit of time, e.g., kilowatts per hour (kW/h). Display 40 also includes a first disk analog segment 44, a second disk analog segment 46, a third disk analog segment 48 and direction arrows 50, 52. Direction arrows 50, 52 are current direction indicators that, along with segments 44, 46, 48 indicate the direction of current flow. Display 40 further includes a plurality of register annunciators 54, a test mode annunciator 56, an alternate display mode annunciator 58, and a rate annunciator 60. Register annunciators 54 illuminate to identify which rate period is presently in effect and test mode annunciator 56 illuminates to signal that the meter is in the test mode. Alternate display mode annunciator 58 identifies when the meter is in an alternate display mode and rate annunciator 60 illuminates to indicate the active rate. Display 40 still further includes small numbers 62 that illuminate to identify which alternate display is being presented and to indicate other displays such as error codes ("Er"), date ("dt"), and time (Hr"). Display 40 also includes a communications annunciator 64 that illuminates to indicate a communication is in progress. In one embodiment, display 40 is a liquid crystal display.

Figure 3:
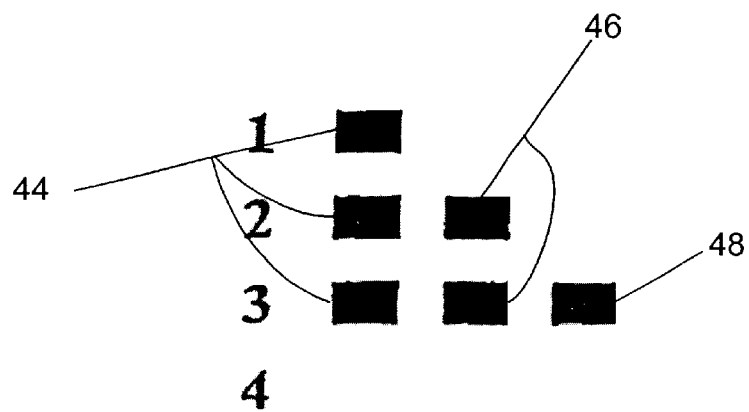
FIG. 3 is a schematic of a series of disk analog segments for the display illustrated in FIG. 2.

Alternatively, display 40 could be an LED display. FIG. 3 is a schematic illustration of the illumination sequence of segments 44, 46, 48. Segments 44, 46, 48 sequentially illuminate, or are activated, under control of controller 20, and the illuminated segments remain illuminated until a predetermined event occurs. Upon the occurrence of the predetermined event, the segments simultaneously blank, or are deactivated. The sequential illumination and then blanking of the segments repeat every time an energy consumption unit is measured by the meter. The sequential illumination and simultaneous blanking provide a notice mechanism to alert a servicing technician that the measurement of an energy consumption unit, i.e., energy consumed during a unit of time, is about to be completed. This notice allows the technician to perform the tasks needed to ensure accurate measurement of the predetermined event.

In one embodiment, segments 44, 46, 48 illuminate to indicate the direction of current flowing through the meter and the rate at which energy is being consumed by the load. As the meter measures energy consumed by the load, segments 44, 46, 48 illuminate in a pre-set sequence and then blank to indicate the completed measurement of one energy consumption unit. As the meter begins measurement of a power consumption unit, segments 44, 46, 48 are blank. First segment 44 illuminates to indicate the measurement of a first predetermined portion of the energy consumption unit. First segment 44 remains illuminated as second segment 46 illuminates to indicate the measurement of a second predetermined portion of the energy consumption unit. First segment 44 and second segment 46 remain illuminated as third segment 48 illuminates to indicate the measurement of a third predetermined portion of the energy consumption unit. First segment 44, second segment 46, and third segment 48 remain illuminated until a fourth predetermined portion of the energy consumption unit is measured. When the fourth predetermined portion of the energy consumption unit is measured, first segment 44, second segment 46, and third segment 48 simultaneously blank to indicate that the meter has measured one entire energy consumption unit. In one embodiment, first segment 44 illuminates when approximately 70% of the energy consumption unit is measured by the meter. First segment 44 remains illuminated as second segment 46 illuminates when approximately 80% of the energy consumption unit is measured by the meter. First segment 44 and second segment 46 remain illuminated as third segment 48 illuminates when approximately 90% of the energy consumption unit is measured by the meter. First segment 44, second segment 46, and third segment 48 remain illuminated until approximately 100% of the energy consumption unit is measured by the meter. When approximately 100% of the energy consumption unit is measured by the meter, first segment 44, second segment 46, and third segment 48 simultaneously blank to indicate that the meter has measured one entire energy consumption unit.

For example, if the energy consumption unit (kh) is 7.2 wh, then first segment 44 will illuminate when the meter has measured approximately 5.04 wh, second segment 46 will illuminate when the meter has measured approximately 5.76 wh, and third segment 48 will illuminate when the meter has measured approximately 6.48 wh. First segment 44, second segment 46, and third segment 48 will blank, or turn off, when the meter has measured 7.2 wh, or one disk rotation. After measuring each unit of energy consumption, the meter immediately begins to measure the next energy consumption unit in a manner similar to that described above. Of course other values could be used for the predetermined portions and more or less disk analog segments could be used than the three described above.

When current flows through the meter in one direction, segments 44, 46, 48 illuminate in the order described above. If current flows through the meter in the opposite direction, segments 44, 46, 48 illuminate in the reverse order, i.e., segment 48 will illuminate first, segment 46 will illuminate second, and then segment 44 will illuminate last. This will indicate to the technician that a. problem may exist with the meter connection and needs to be remedied.

The display of disk analog segments 44, 46, 48 simulates the rotation of a meter disk on a mechanical electricity meter. The illumination of segment 44 indicates 70 percent rotation, the illumination of segment 46 indicates 80 percent rotation, and the illumination of segment 48 indicates 90 percent rotation. In addition, the simultaneous blanking of segments 44, 46, 48 indicates the completed rotation of a meter disk on a mechanical electricity meter. In this manner, a technician can easily determine whether the meter is connected properly by timing the illumination sequence of disk analog segments 44, 46, 48.

The above described meter display can be used with an electronic electricity meter. The display includes a series of segments that illuminate and blank in a preset sequence to visually depict the measurement by the meter of one energy consumption unit. The illumination sequence notifies the technician that the meter is completing measurement of one energy consumption unit. This notice enables the technician to accurately measure the time it takes the meter to measure one energy consumption unit.

From the preceding description of various embodiments of the present invention, it is evident that the objects of the invention are attained. Although the invention has been described and illustrated in detail, it is to be clearly understood that the same is intended by way of illustration and example only and is not to be taken by way of limitation. Accordingly, the spirit and scope of the invention are to be limited only by the terms of the appended claims.

What is claimed is:

1. A solid state electricity meter comprising a disk analog display for indicating the direction of current flow through said meter and the rate at which energy is being consumed by a load, said disk analog display comprising a plurality of segments configured to sequentially illuminate for indicating the direction of current flow and the rate at which energy is being consumed by the load and then simultaneously blank to indicate the measurement of one energy consumption unit by said meter.

2. An electricity meter in accordance with claim 1 wherein said plurality of segments comprises a series of segments configured to illuminate in a pre-set sequence.

3. An electricity meter in accordance with claim 2 wherein said series of segments comprises a first segment, a second segment, and a third segment configured to illuminate sequentially.

4. An electricity meter in accordance with claim 3 wherein said first segment is configured to illuminate when approximately 70% of a predetermined energy consumption unit is measured.

5. An electricity meter in accordance with claim 3 wherein said second segment is configured to illuminate when approximately 80% of a predetermined energy consumption unit is measured.

6. An electricity meter in accordance with claim 3 wherein said third segment is configured to illuminate when approximately 90% of a predetermined energy consumption unit is measured.

7. An electricity meter in accordance with claim 3 wherein said first segment, said second segment, and said third segment are configured to blank when approximately 100% of a predetermined energy consumption unit is measured.

8. A disk analog display for a solid state electricity meter, said disk analog display for simulating the rotation of an electromechanical disk on an electromechanical meter and the rate at which energy being consumed by a load said disk analog display comprising a series of segments that sequentially illuminate in sequence to indicate the direction of current flow through the meter and the rate at which energy is being consumed by the load and then simultaneously blank to indicate the measurement of one energy consumption unit by the meter.

9. A disk analog display in accordance with claim 8 wherein said series of segments are configured to illuminate in a pre-set sequence.

10. A disk analog display in accordance with claim 9 wherein said series of segments comprise a first segment, a second segment, and a third segment configured to illuminate sequentially.

11. A disk analog display in accordance with claim 10 wherein said first segment is configured to illuminate when approximately 70% of a predetermined energy consumption unit is measured.

12. A disk analog display in accordance with claim 10 wherein said second segment is configured to illuminate when approximately 80% of a predetermined energy consumption unit is measured.

13. A disk analog display in accordance with claim 10 wherein said third segment is configured to illuminate when approximately 90% of a predetermined energy consumption unit is measured.

14. A disk analog display in accordance with claim 10 wherein said first segment, said second segment, and said third segment are configured to blank when approximately 100% of a predetermined energy consumption unit is measured.

15. A method of displaying the direction of current flow through a solid state electricity meter and the rate at which energy is being consumed by a load, said meter including a disk analog display, said method comprising the steps of:
   determining the direction of current flow through the meter;
   determining the rate at which energy is being consumed by the load; and
   displaying on the disk analog display the direction of current flowing through the meter, the rate at which energy is being consumed by the load and blanking the disk analog display as an indication when the meter has completed measurement of one energy consumption unit.

16. A method in accordance with claim 15 wherein the disk analog display includes a series of segments that illuminate and said step of displaying comprises the step of illuminating at least one segment to indicate the direction of current flowing through the meter and the rate at which energy is being consumed by the load.

17. A method in accordance with claim 16 wherein said step of illuminating at least one segment comprises the step of illuminating a series of segments to indicate the direction of current flowing through the meter and the rate at which energy is being consumed by the load.

18. A method in accordance with claim 17 wherein said step of illuminating a series of segments comprises illuminating a series of segments in a pre-set sequence.

19. A method in accordance with claim 18 wherein said pre-set sequence comprises a repetitive pattern.

20. A method in accordance with claim 18 wherein said step of illuminating a series of segments in a pre-set sequence comprises:
   illuminating a first segment when approximately 70% of a predetermined energy consumption unit is measured;
   illuminating a second segment when approximately 80% of a predetermined energy consumption unit is measured;
   illuminating a third segment when approximately 90% of a predetermined energy consumption unit is measured; and
   blanking the first, second, and third segments when approximately 100% of an energy consumption unit is measured.

* * * * *